(12) United States Patent
Tognetti

(10) Patent No.: US 6,716,288 B2
(45) Date of Patent: Apr. 6, 2004

(54) REACTOR FOR MANUFACTURING A SEMICONDUCTOR DEVICE

(75) Inventor: Marcel Tognetti, Dresden (DE)

(73) Assignee: Semiconductor300 GmbH & Co. KG, Dresden (DE)

( * ) Notice: Subject to any disclaimer, the term of this patent is extended or adjusted under 35 U.S.C. 154(b) by 0 days.

(21) Appl. No.: 09/768,391

(22) Filed: Jan. 24, 2001

(65) Prior Publication Data

US 2001/0018895 A1 Sep. 6, 2001

(30) Foreign Application Priority Data

Jan. 24, 2000 (EP) .......................................... 001 01 362

(51) Int. Cl.[7] .............................................. C23C 16/00
(52) U.S. Cl. ........................................ 118/733; 34/242
(58) Field of Search ............................ 118/773; 34/242; 277/647, 653, 913, 928

(56) References Cited

U.S. PATENT DOCUMENTS

| | | | | |
|---|---|---|---|---|
| 3,441,000 A | * | 4/1969 | Burd et al. ................. 118/49.1 |
| 4,018,184 A | * | 4/1977 | Nagasawa et al. ......... 118/49.1 |
| 4,149,905 A | * | 4/1979 | Levinstein et al. .......... 148/1.5 |
| 4,220,941 A | * | 9/1980 | Mahieu et al. .............. 337/250 |
| 4,253,417 A | * | 3/1981 | Valentijn .................... 118/733 |
| 4,266,507 A | * | 5/1981 | Satoh ......................... 118/733 |
| 4,310,162 A | * | 1/1982 | Donovan ..................... 277/628 |
| 4,472,622 A | * | 9/1984 | Satoh et al. ................. 219/390 |
| 4,544,074 A | * | 10/1985 | Evans ......................... 215/355 |
| 4,684,863 A | | 8/1987 | Aldridge et al. |
| 5,181,730 A | * | 1/1993 | Hjertholm .................... 285/80 |
| 5,368,648 A | * | 11/1994 | Sekizika ..................... 118/733 |
| 5,370,736 A | * | 12/1994 | Roy et al. ................... 118/719 |
| 5,417,537 A | * | 5/1995 | Miller ......................... 414/217 |
| 5,484,483 A | * | 1/1996 | Kyogoku ..................... 118/719 |
| 5,498,292 A | | 3/1996 | Ozaki |
| 5,528,972 A | * | 6/1996 | Wilson et al. ................... 89/7 |
| 5,596,814 A | * | 1/1997 | Zingle et al. ................. 34/296 |
| 5,951,282 A | | 9/1999 | Sakata et al. |
| 5,984,607 A | * | 11/1999 | Oosawa et al. ......... 414/222.06 |
| 6,187,102 B1 | * | 2/2001 | Yamamoto ................... 118/725 |
| 6,273,426 B1 | * | 8/2001 | Daoud et al. ................ 277/303 |

FOREIGN PATENT DOCUMENTS

| | | | |
|---|---|---|---|
| CH | 684761 A5 | 12/1994 | |
| DE | 41 37 957 A1 | * 11/1991 | .......... A61M/39/00 |
| EP | 0 143 697 A2 | 6/1985 | |

* cited by examiner

Primary Examiner—Parviz Hassanzadel
Assistant Examiner—Karla Moore
(74) Attorney, Agent, or Firm—Laurence A. Greenberg; Werner H. Stemer; Ralph E. Locher

(57) ABSTRACT

There is described a reactor for manufacturing a semiconductor device. The reactor includes a container for enclosing a gas and has an aperture and a surface ambient to the aperture. A seal for sealing the aperture of the container with a surface is pressed against the surface of the container. Portions of the surface of the container and corresponding portions of the surface of the seal form a combination of a beveled peak and groove surrounding the aperture. Therefore, with improved sealing a pressure variation of the gas within the container caused by a pressure variation in the ambient environment is reduced.

15 Claims, 3 Drawing Sheets

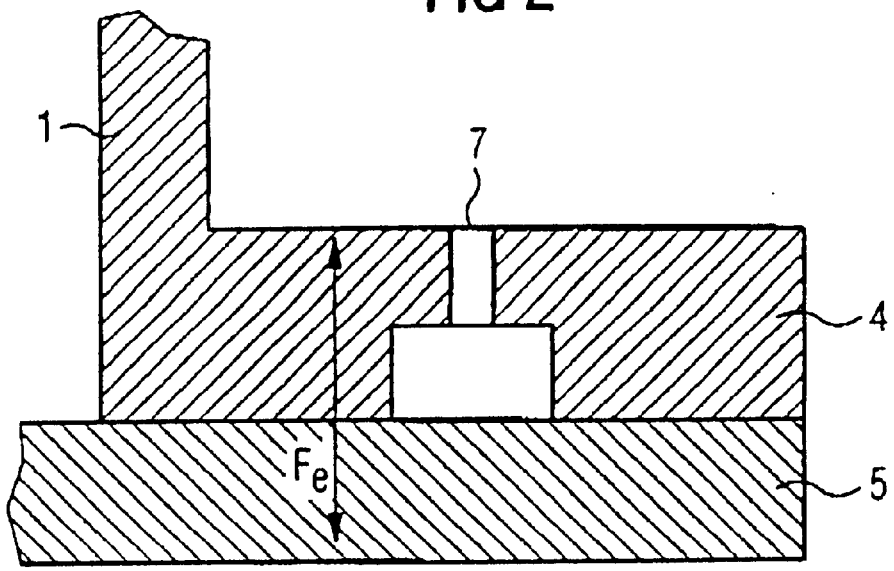
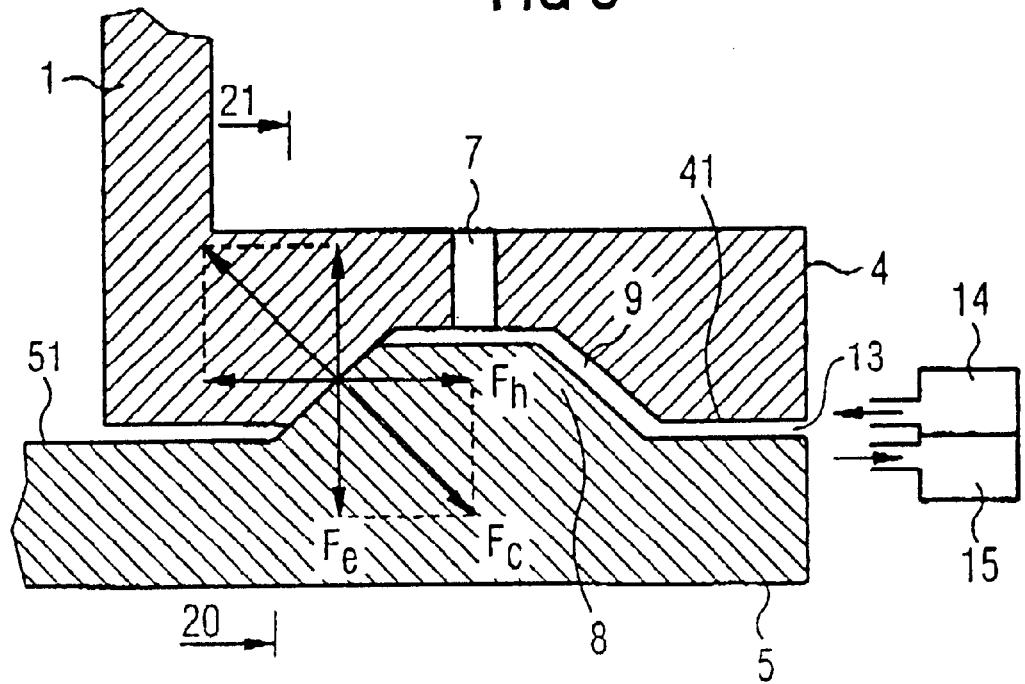

| α [°] | $F_c$ [N] | $F_h$ [N] | $F_f$ [N] |
|---|---|---|---|
| 30 | 57.7 | 28.8 | 17.3 |
| 45 | 70.7 | 50.0 | 21.2 |
| 60 | 100 | 86.6 | 30 |

REACTOR FOR MANUFACTURING A SEMICONDUCTOR DEVICE

BACKGROUND OF THE INVENTION

Field of the Invention

The present invention relates to a reactor for manufacturing a semiconductor device. The reactor includes a container for enclosing a gas. The container has an aperture, a surface surrounding the aperture, and a seal for sealing the aperture of the container with a surface pressed against the surface of the container.

Configurations for enclosing a gas are used in various technical fields. In the technical field of manufacturing semiconductor devices it is common and necessary to use reactors, in particular for oxidation and/or annealing processes. Such kinds of configurations usually include a container formed in the shape of a process tube with wafers disposed inside the process tube piled up on a device that is called a boat. Further, the process tube usually contains a tube flange surrounding the aperture of the process tube. Usually, the tube-shaped reactor is sealed by a seal which is formed like a door plate. For sealing, the door plate is pressed against the tube flange which is ambient to the aperture of the reactor by a closing force. For good process results, there usually is a great demand for gas-tight sealing so that the process pressure inside the reactor does not vary with the ambient pressure of the environment. Another aim of good sealing is to prevent the enclosed gas from passing through the seal.

Especially in the field of manufacturing semiconductor devices, reactors for oxidation and/or annealing processes such as atmospheric furnaces are operated with high process temperatures, e.g. up to 1,050° C. The high process temperatures usually make it necessary to use quartz as a material for the reactor tube and the sealing door plate. This type of sealing is usually not absolutely gas-tight which makes the process pressure vary with the ambient atmospheric pressure. Hence, especially in atmospheric furnaces where the oxide growth-rate depends on the reactor pressure, the film thickness is dependent on the ambient pressure.

In various forms of well-known configurations for sealing apertures of process reactors, for example metal plates or chambers having additional sealing materials are used, which can be flexible particularly to improve good contact. Due to the aforementioned high process temperatures these kinds of materials usually cannot be used in these kinds of process reactors. Other forms of sealing configurations contain very smooth and flat surfaces of the tube flange ambient to the aperture and the sealing door plate. In some applications, there is additionally or alternatively a groove in the tube flange that is evacuated or pressurized. Further, there can be a pressurized area around the flange that has a positive seal to the ambient environment. These features are especially necessary for chemical sealing, which prevents a gas from passing through the sealing and therefore getting into the reactor or getting out of the reactor.

In order to get a good quartz-to-quartz sealing effect it is necessary to have very flat and smooth quartz surfaces extending to the whole surface of the tube flange and the door plate. For manufacturing such kinds of surfaces, suitable production processes that are usually required are often relatively expensive. Furthermore, in some applications these kinds of configurations are not sufficient for providing a good sealing.

SUMMARY OF THE INVENTION

It is accordingly an object of the invention to provide a reactor for manufacturing a semiconductor device which overcomes the above-mentioned disadvantages of the prior art devices of this general type, which is capable of reducing pressure variations within the container caused by pressure variations in the ambient environment.

With the foregoing and other objects in view there is provided, in accordance with the invention, a reactor for manufacturing a semiconductor device. The reactor includes a container for enclosing a gas and has an aperture formed therein. The container has a surface surrounding the aperture and the surface has a portion with a groove formed therein. A seal for sealing the aperture of the container is provided. The seal has a surface and a portion of the surface has a beveled peak aligned with the groove of the container. The surface of the seal presses against the surface of the container including the beveled peak engaging in the groove for sealing the aperture of the container.

The reactor includes the container for enclosing the gas and has the aperture and the surface surrounding the aperture. The sealing of the aperture of the container is formed from the surface of the plate door (i.e. the seal) pressed against the surface of the container. More specifically, portions of the surface of the container and corresponding portions of the surface of the seal form a combination of a beveled peak and a groove surrounding the aperture.

According to the present invention, the reactor provides better sealing properties. The desired sealing is reached through the contact of the corresponding parts of the beveled peak and groove placed on the surface of the container and the seal. These portions of the surface, which are relatively small compared to the surface of the container surrounding the aperture and the surface of the seal, usually are required to be very flat and smooth in order to get a proper sealing. However, the sealing depends less on the flatness of the whole respective surfaces. Due to the relatively small sizes of the contacting surfaces, the reactor can be manufactured by existing technologies at about the same cost.

The provided reactor is applicable to various reactors containing the container for enclosing the gas and the corresponding seal for sealing the container. The provided reactor is preferably capable for oxidation and/or annealing processes. Advantageously, the reactor is applicable in reactors containing a furnace due to the relatively high process temperatures. In such kinds of applications the parts of the contacting surface of the container and surface of the seal are usually formed of quartz.

The effect of an improved sealing can be observed significantly in atmospheric furnaces, where the oxide growth-rate during the process depends on the reactor pressure. Since the process pressure does not vary with the ambient atmospheric pressure, the film thickness is independent from the ambient pressure. In particular, oxidation processes that use HCl are better contained.

For example, a typical configuration of an atmospheric furnace reactor includes a sealing door plate formed of quartz and a process tube put upon the door plate, the process tube containing a tube flange. For sealing the process tube the door plate is pressed against the tube flange by a closing force. In an embodiment of the present invention, due to the configuration of the beveled peak and the groove surrounding the process tube the closing force has a horizontal component that acts in a direction where both the flange and the door plate have a higher stiffness. The result is less deformation when the closing force is applied.

Concerning the aforementioned benefits of the present invention, the reactor is especially capable for oxidation and/or annealing processes. Furthermore, the provided reactor can be used in various overpressure applications as well as in various vacuum applications. Regarding the high requirements during the manufacturing of the semiconductor device, the reactor is especially capable for the manufacturing of semiconductor wafers with present and future technologies. In particular, with regard to the high requirements of manufacturing wafers with an increased diameter, e.g. of wafers with at least 300 mm in diameter, the benefits of the present invention can be clearly observed.

In a preferred embodiment of the invention, the peak and groove contain cross-sectional areas with corresponding shapes and bevel angles. Furthermore, asymmetrical bevel angles are possible. In particular, the dimension of the bevel angles depends on the present surface and available closing force. Especially, by good fitting of the peak and groove an improved sealing effect can be observed.

To this end, the peak and groove advantageously contain cross-sectional areas with different sizes. For example, the peak has a smaller cross-sectional area compared with the cross-sectional area of the corresponding groove. This ensures good contact at the contacting surfaces. Furthermore, to improve the fitting against each other the seal and/or the container are capable of moving vertical to the pressing direction.

In a preferred embodiment, the peak and groove are circular shaped. For example, the diameter of the peak that is formed like a ring is different from the diameter of the groove. In the process of pressing the seal against the surface of the container there can be observed a self-centering effect. Depending on the process the respective diameter of the ring and/or groove is dimensioned such that the ring closes inside or outside.

As mentioned above, the present invention can be used advantageously in various overpressure or vacuum applications. Therefore, in an embodiment of the invention the reactor according to the present invention contains an environment with a gas having a pressure of a first level, the gas within the container having a pressure of a second level, wherein the first and second levels are different.

In a preferred embodiment, the reactor contains a purging device for purging a present volume between the peak and groove, or the reactor contains an evacuating device for evacuating a present volume between the peak and groove. With the purging device and the evacuating device, respectively, the chemical sealing of the reactor can be improved. Depending on the application a present volume between the peak and the groove is purged or evacuated, respectively, so that the desired chemical sealing is achieved.

Preferably, the surface of the container and the surface of the seal ambient to the peak and groove are flat and straight-lined. With flat and straight-lined surfaces a good sealing effect with the contacting peak and groove can be observed. Therefore, no other contacting regions of the surfaces can disturb the sealing effect of the contacting surfaces of the peak and groove.

In accordance with an added feature of the invention, the portion of the surface of the container and the portion of the surface of the seal are formed of quartz.

In accordance with another feature of the invention, the beveled peak has a given diameter and the groove has a diameter different from the given diameter of the beveled peak.

In accordance with an additional feature of the invention, the container performs oxidation and annealing processes.

In accordance with a further feature of the invention, a furnace is disposed next to the container.

In accordance with a concomitant feature of the invention, the container is dimensioned for handling and processing a wafer with a diameter of at least 300 mm.

Other features which are considered as characteristic for the invention are set forth in the appended claims.

Although the invention is illustrated and described herein as embodied in a reactor for manufacturing of a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a cross-sectional view of a sealing configuration;

FIG. 3 is a cross-sectional view of the sealing configuration according to the invention.

DESCRIPTION OF THE PREFERRED EMBODIMENTS

Figure 1:
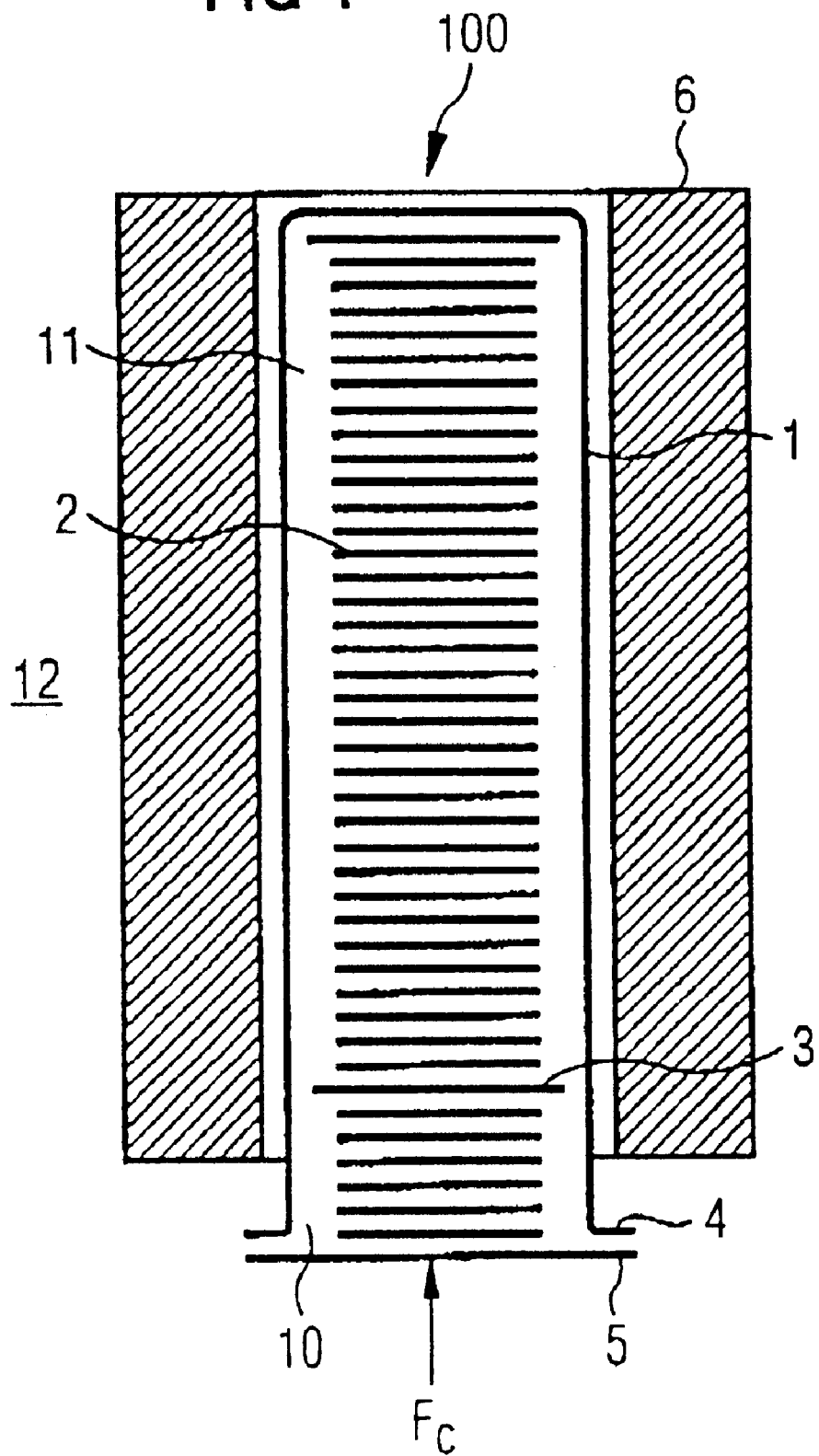
FIG. 1 is a diagrammatic, sectional view of an atmospheric furnace reactor.

In all the figures of the drawing, sub-features and integral parts that correspond to one another bear the same reference symbol in each case. Referring now to the figures of the drawing in detail and first, particularly, to FIG. 1 thereof, there is shown a furnace reactor 100 containing a process tube 1 with a tube flange 4, a heater 6 surrounding the process tube 1 and a door plate 5 (i.e. a seal 5) for sealing an aperture 10 of the process tube 1. Inside the process tube 1 there is placed a so-called boat 3 where wafers 2 are piled up. For sealing the aperture 10 of the process tube 1 the door plate 5 is pressed against the tube flange 4 of the process tube 1. Therefore, a closing force $F_c$ is applied to the door plate 5 with a direction vertical to the surface of the tube flange 4. As it is visible from the drawing, the closing force $F_c$ acts in a direction where the door plate 5 easily deforms. The closing force $F_c$ is usually applied by an elevator so it is equal to an elevator force $F_e$. Due to high process temperatures in the process tube 1 applied by the heater 6 the contacting parts of the door plate 5 and the tube flange 4 are formed of quartz. Depending on the applicable process the reactor contains an environment with a gas 12 having a pressure of a first level and a gas 11 within the process tube 1 having a pressure of a second level. The first and second levels can be different.

FIG. 2 shows a cross-sectional view of the sealing configuration including parts of the door plate 5 and the tube flange 4. For a proper sealing, it is necessary that the surfaces of the door plate 5 and the tube flange 4 are very smooth and flat. To improve chemical sealing a purge/ vacuum connection 7 can be created in the tube flange 4 that is evacuated or pressurized. Furthermore, it is possible to create a pressurized area around the flange 4 that has a positive seal to the ambient environment. Since this type of sealing is not absolutely gas-tight, which results in that parts of the gas can still pass through the sealing, and therefore the process pressure inside the process tube varies with the ambient atmospheric pressure. Thus, a film thickness on the wafers 2 is dependent on the ambient pressure.

FIG. 3 illustrates schematically a sealing configuration according to an embodiment of the invention. As it is visible from the drawing, parts of a surface 41 of the tube flange 4 and corresponding parts of a surface 51 of the door plate 5 form a combination of a beveled peak 8 and a groove 9 surrounding the aperture 10 of the process tube 1. In this embodiment, the peak 8 and the groove 9 contain cross-sectional areas with corresponding shapes and bevel angles $\alpha$ (see also FIG. 4). With the elevator force $F_e$ the surface 51 of the door plate 5 is pressed against the surface 41 of the tube flange 4. To ensure good contact the cross-sectional areas of the peak 8 and groove 9 advantageously have different sizes. To this end, the door plate 5 and/or the tube flange 4 and the process tube 1, respectively, are capable of moving vertical to the pressing direction of the elevator force $F_e$.

Since the process tube 1 and the corresponding door plate 5 are usually formed in a circular shape, the peak 8 and the groove 9 are preferably circular shaped as well. Thus, the peak 8 is formed like a ring. Depending on the process in the process tube 1, the peak 8 and the corresponding parts of the groove 9 close on the side shown in FIG. 3 or the peak 8 and the groove 9 close on the other side, respectively. Therefore, for this application a diameter 20 of the peak 8 and a diameter 21 of the groove 9 are different.

For improving chemical sealing, a volume 13 between the peak 8 and the groove 9 can be purged or evacuated through the purge/vacuum connection 7. Therefore, the reactor contains a purging device 14 for purging the volume 13 and/or an evacuating device 15 for evacuating the volume 13. The application of the purging or evacuating, respectively, usually depends on the process executed in the tube flange 4.

Figure 4:
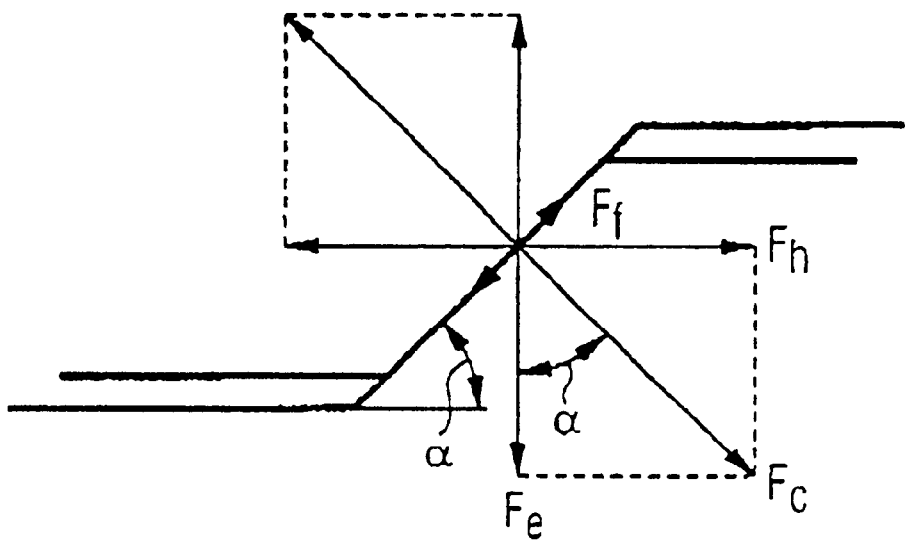
FIG. 4 shows a diagram and a corresponding table with different bevel angles and related forces.

FIG. 4 shows a diagram and a corresponding table with different bevel angles $\alpha$ and relating forces $F_c$, $F_h$, $F_f$. As it can be seen from the diagram, the closing force $F_c$ has a horizontal component $F_h$ that acts in the direction where both the flange 4 and the door plate 5 have a higher stiffness. Advantageously, this results in less deformation of the door plate 5. Due to the bevel angle $\alpha$, with the same elevator force $F_e$ as in FIG. 2 there is applied a higher closing force $F_c$.

In the table shown in conjunction with FIG. 4, examples of the different bevel angles $\alpha$ are shown with the corresponding forces. $F_f$ denotes a friction force resulting from the product of a friction coefficient $c_f$ and the closing force $F_c$. The table shows the resulting forces for an elevator force $F_e$=50N and the friction coefficient $c_f$=0.3. Thereby, the respective closing force $F_c$ and the horizontal force $F_h$ can be calculated by well-known formulas regarding the different bevel angles $\alpha$.

I claim:

1. A reactor for manufacturing a semiconductor device, comprising:
   a container for enclosing a gas and having an aperture formed therein, said container having a first surface surrounding said aperture;
   a seal for sealing said aperture of said container, said seal having a second surface pressing against said surface of said container; and
   a sealing structure surrounding said aperture, said sealing structure including a groove formed in one of said first and second surfaces and a beveled peak formed on another of said first and second surfaces, said beveled peak engaging in said groove for sealing said aperture of said container.

2. The reactor according to claim 1, wherein said groove and said beveled peak are formed of quartz.

3. The reactor according to claim 1, wherein said beveled peak and said groove contain cross-sectional areas with corresponding shapes and bevel angles.

4. The reactor according to claim 1, wherein said beveled peak and said groove have cross-sectional areas of different sizes.

5. The reactor according to claim 1, wherein at least one of said seal and said container are capable of moving vertical to a pressing direction.

6. The reactor according to claim 1, wherein said beveled peak and said groove are circular shaped.

7. The reactor according to claim 6, wherein said beveled peak has a given diameter and said groove has a diameter different from said given diameter of said beveled peak.

8. The reactor according to claim 1, wherein said surface of said container and said surface of said seal ambient to said peak and said groove are flat and straight-lined.

9. The reactor according to claim 1, wherein said first surface of said container forms said groove and said second surface of said seal forms said peak.

10. The reactor according to claim 1, wherein said container is surrounded by an environment having a given gas with a pressure of a first level, and the gas within said container having a pressure of a second level being different than said first level.

11. The reactor according to claim 1, including a purging device fluidically communicating with said container for purging a present volume between said beveled peak and said groove.

12. The reactor according to claim 1, including an evacuating device fluidically communicating with said container for evacuating a present volume between said beveled peak and said groove.

13. The reactor according to claim 1, wherein said container performs oxidation and annealing processes.

14. The reactor according to claim 1, including a furnace disposed next to said container.

15. The reactor according to claim 1, wherein said container is dimensioned for handling and processing a wafer with a diameter of at least 300 mm.

* * * * *